(12) United States Patent
Srivastava et al.

(10) Patent No.: US 10,063,219 B1
(45) Date of Patent: Aug. 28, 2018

(54) AUGMENTED INTERMEDIATE VOLTAGE GENERATOR BASED CORE TO PAD LEVEL SHIFTER

(71) Applicant: QUALCOMM Incorporated, San Diego, CA (US)

(72) Inventors: Manish Srivastava, Bangalore (IN); Satadru Sarkar, Bangalore (IN); Samarth Vasishtha, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/663,209

(22) Filed: Jul. 28, 2017

(51) Int. Cl.
*H03K 19/0175* (2006.01)
*H03K 3/356* (2006.01)
*H03K 19/0185* (2006.01)
*H03K 19/003* (2006.01)
*H03K 19/094* (2006.01)

(52) U.S. Cl.
CPC . *H03K 3/356113* (2013.01); *H03K 19/00315* (2013.01); *H03K 19/018521* (2013.01); *H03K 19/09429* (2013.01)

(58) Field of Classification Search
CPC ....... H03K 19/00315; H03K 3/356113; H03K 19/018521; H03K 19/09429
USPC .......................................................... 326/68
See application file for complete search history.

(56) References Cited

U.S. PATENT DOCUMENTS

| 5,684,415 | A | | 11/1997 | McManus | |
|---|---|---|---|---|---|
| 5,821,800 | A | * | 10/1998 | Le | H03K 17/102 326/62 |
| 5,969,542 | A | * | 10/1999 | Maley | H03K 3/012 326/17 |
| 6,642,769 | B1 | * | 11/2003 | Chang | H03K 3/356113 326/68 |
| 6,788,125 | B1 | * | 9/2004 | Tomsio | H03K 19/018521 327/333 |
| 7,129,770 | B2 | * | 10/2006 | Barkley | G05F 3/205 327/534 |
| 7,397,279 | B2 | * | 7/2008 | Bhattacharya | H03K 19/017509 326/63 |
| 7,746,146 | B2 | | 6/2010 | Chou et al. | |
| 8,436,671 | B2 | * | 5/2013 | Chern | H03K 19/018521 326/81 |
| 8,742,821 | B2 | * | 6/2014 | Liu | H03K 3/356113 326/80 |
| 9,331,673 | B2 | | 5/2016 | Williams et al. | |
| 2008/0238523 | A1 | * | 10/2008 | Thorp | H03K 3/35613 327/333 |
| 2011/0298519 | A1 | * | 12/2011 | Liu | H03K 3/012 327/333 |
| 2017/0359069 | A1 | * | 12/2017 | Feldtkeller | H03K 19/017518 |

FOREIGN PATENT DOCUMENTS

| CN | 101826864 A | 9/2010 |
|---|---|---|
| IN | 2297DEL2007 A | 6/2009 |

* cited by examiner

*Primary Examiner* — Don Le
(74) *Attorney, Agent, or Firm* — Loza & Loza, LLP/Qualcomm (57) ABSTRACT

Aspects of the disclosure are directed to a voltage level shifter architecture, including a voltage level shifter with circuitry residing within a footprint; and an internal augmented voltage generator residing within the footprint, wherein the internal augmented voltage generator is coupled to the voltage level shifter to augment a voltage level shift.

21 Claims, 11 Drawing Sheets

| $V_{in}$(volts) | $V_{out}$(volts) | Process | Temp (degree C) | Bias Voltage (volts) | Freq(MHz) |
|---|---|---|---|---|---|
| 0.35 | 1.8 | tt | 25 | 1.29 | 100 |
| 0.35 | 1.2 | tt | 25 | 0.776 | 100 |
| 0.35 | 1.08 | tt | -40 | 0.665 | 100 |
| 0.465 | 1.95 | ss | -40 | 1.1 | 200 |
| 0.465 | 1.08 | ss | -40 | 0.597 | 200 |
| 0.465 | 1.95 | ff | 125 | 1.41 | 200 |

| | C2P |
|---|---|
| IDynamic | 201uA |
| Ileak(A=0) | 266n |
| Ileak(A=1) | 271n |

910

| | C2P | C2C2P |
|---|---|---|
| Area | 130um^2 | 130um^2 |

| PVT | Duty Cycle Variation(%) |
|---|---|
| 0.465v_1.08v_SS_-40C | ~49% - 50.50% |
| 0.465v_1.95v_SS_-40C | ~49% - 51.50% |
| 0.465v_1.95v_SS_125C | ~50% - 50.5% |

AUGMENTED INTERMEDIATE VOLTAGE GENERATOR BASED CORE TO PAD LEVEL SHIFTER

TECHNICAL FIELD

This disclosure relates generally to the field of voltage level shifter, and, in particular, to voltage level shifter for core to pad voltage shifting.

BACKGROUND

In digital electronics circuits, a variety of logic families may be utilized to perform circuit functionality. In one example, different logic families may require different signal voltage levels. For example, digital electronic circuits may require a shift in signal voltage level from a low voltage state to a high voltage state. In general, a digital electronic circuit may be comprised of a plurality of logic families each operating with a different voltage state. For example, a first logic family may operate with a low voltage state and a second logic family may operate with a high voltage state. When the first logic family connects to the second logic family, the low voltage state of the first logic family needs to be shifted to the high voltage state of the second logic family. Thus, a voltage level shifter may be required in the digital electronic circuit.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a level shifter architecture, including a voltage level shifter including circuitry residing within a footprint; and an internal augmented voltage generator residing within the footprint, wherein the internal augmented voltage generator is coupled to the voltage level shifter to augment a voltage level shift. The voltage level shifter may include at least two thick oxide NMOS transistor devices. In one example, the internal augmented voltage generator includes: a plurality of diode connected NMOS transistor devices, wherein each of the plurality of diode connected NMOS transistor devices are electrically connected to each other in series; and a plurality of grounded gate NMOS transistor devices, wherein each of the plurality of grounded gate NMOS transistor devices are electrically connected. In one example, each of the plurality of grounded gate NMOS transistor devices is electrically connected to one or more of the diode connected NMOS transistor devices. In one example, at least one of the plurality of grounded gate NMOS transistor devices is electrically connected to at least one of the plurality of diode connected NMOS transistor devices. In one example, the at least one of the plurality of grounded gate NMOS transistor devices includes a drain; and the at least one of the plurality of diode connected NMOS transistor devices includes a gate; and wherein the drain is electrically connected to the gate. In one example, the internal augmented voltage generator generates an augmented voltage. In one example, the at least two thick oxide NMOS transistor devices receive the augmented voltage. In one example, the voltage level shifter includes at least two thin oxide NMOS transistor devices, wherein the at least two thin oxide NMOS transistor devices are coupled to the input signal whose voltage range is shifted from a core voltage range to a pad voltage range. In one example, the level shifter architecture further includes a plurality of routing resources for coupling the internal augmented voltage generator to the voltage level shifter, wherein the plurality of routing resources resides within the footprint.

Another aspect of the disclosure provides an apparatus for voltage level shifting, including means for voltage level shifting, wherein the means for voltage level shifting resides within a footprint; and means for generating an augmented voltage, wherein the means for generating an augmented voltage resides within the footprint, and wherein the means for generating an augmented voltage is coupled to the means for voltage level shifting to provide an augmented voltage to the means for voltage level shifting. In one example, the means for voltage level shifting includes at least two thick oxide transistor devices. In one example, the means for generating an augmented voltage includes a plurality of diode connected transistor devices, wherein each of the plurality of diode connected transistor devices are electrically connected; and a plurality of grounded gate transistor devices, wherein each of the plurality of grounded gate transistor devices are electrically connected. In one example, at least one of the plurality of grounded gate transistor devices is electrically connected to at least one of the plurality of diode connected transistor devices. In one example, the at least one of the plurality of grounded gate transistor devices includes a drain; and the at least one of the plurality of diode connected transistor devices includes a gate; and wherein the drain is electrically connected to the gate. In one example, the means for generating an augmented voltage generates the augmented voltage. In one example, the at least two thick oxide transistor devices receive the augmented voltage. In one example, the means for voltage level shifter includes at least two thin oxide NMOS transistor devices, and the at least two thin oxide NMOS transistor devices are coupled to the input signal whose voltage range is shifted from a core voltage range to a pad voltage range. In one example, the apparatus includes a plurality of routing resources for coupling the means for generating an augmented voltage to the means for voltage level shifting, wherein the plurality of routing resources resides within the footprint.

Another aspect of the disclosure provides a method for implementing a voltage level shift, including providing a voltage level shifter, wherein circuitry of the voltage level shifter resides within a footprint; providing an internal augmented voltage generator, wherein circuitry of the internal augmented voltage generator resides within the footprint; and providing at least one routing resource for coupling the internal augmented voltage generator to the voltage level shifter, wherein the at least one routing resource resides within the footprint. In one example, the method further includes using the at least one routing resource to route an augmented voltage from the internal augmented voltage generator to the voltage level shifter. In one example, the method further includes coupling the voltage level shifter to a pad voltage, wherein the voltage level shifter shifts the voltage range of an input signal from a core voltage range to a pad voltage range.

Another aspect of the disclosure provides a computer-readable medium storing computer executable code, operable on a device including at least one processor and at least one memory coupled to the at least one processor, wherein the at least one processor is configured to implement a voltage level shifter, the computer executable code including instructions for causing a computer to provide a voltage level shifter, wherein circuitry of the voltage level shifter resides within a footprint; instructions for causing the computer to provide an internal augmented voltage generator, wherein circuitry of the internal augmented voltage generator resides within the footprint; and instructions for causing the computer to provide at least one routing resource for coupling the internal augmented voltage generator to the voltage level shifter, wherein the at least one routing resource resides within the footprint. In one example, the computer-readable medium further includes instructions for causing the computer to use the at least one routing resource to route an augmented voltage from the internal augmented voltage generator to the voltage level shifter and instructions for causing the computer to couple the voltage level shifter to a pad voltage, wherein the voltage level shifter shifts the voltage range of an input signal from a core voltage range to a pad voltage range.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Electronic circuits may require a shift in signal voltage level from a low voltage state to a high voltage state. If the voltage offset between the low voltage state and the high voltage state is large, an external augmented voltage source may be required to implement the voltage shift. For example, in a digital electronics circuit, a core voltage may operate with a low voltage state and an input/output (I/O) pad voltage may operate with a high voltage state. In one example, a voltage level shifter with an external augmented voltage source may be added to the electronic circuit to implement the voltage shift. The external augmented voltage source may incur some circuit overhead in circuit pin count and in the voltage routing.

In one example, circuit overhead in circuit pin count and voltage routing may be avoided or minimized by incorporating an internal augmented voltage generator for signal voltage level shifting. Usage of an internal augmented voltage generator may include one or more of the following advantages: no extra power pin, better duty cycle over environmental changes (e.g., pressure, voltage, temperature), lower dc power consumption (e.g., 10% improvement), maintains reliability (due to less voltage stress on thin gate oxide NMOS components; and/or drain voltage reduction (e.g., from 1.2 v to 1.06 v).

Figure 1:
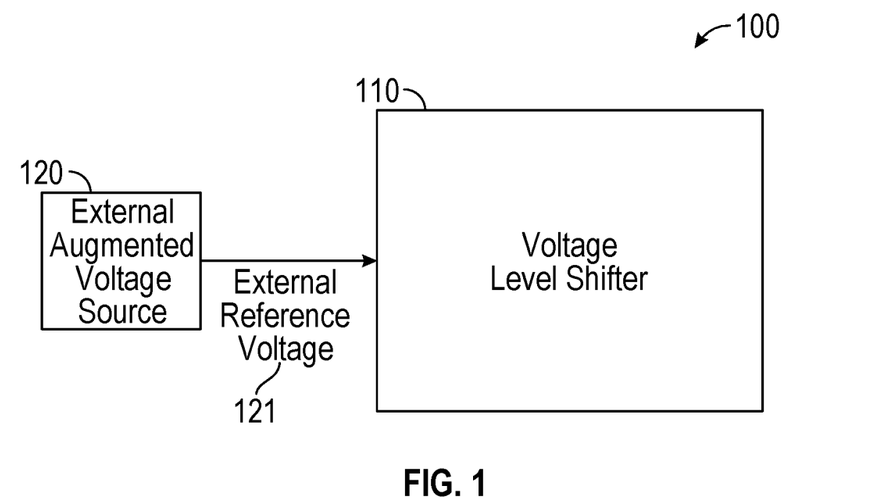
FIG. 1 illustrates an example level shifter architect which includes a voltage level shifter coupled to an external augmented voltage source.

FIG. 1 illustrates an example level shifter architect 100 which includes a voltage level shifter 110 coupled to an external augmented voltage source 120. In this example, the voltage level shifter 110 is a core to pad level shifter and is used to shift signal voltage levels from a low voltage state to a high voltage state with the assistance of the external augmented voltage source 120. In one example, the external augmented voltage source 120 provides an external reference voltage 121 to assist the voltage level shifter 110. In some examples, the external augmented voltage source 120 requires additional power pin(s) and/or additional routing for the external reference voltage 121.

Figure 2:
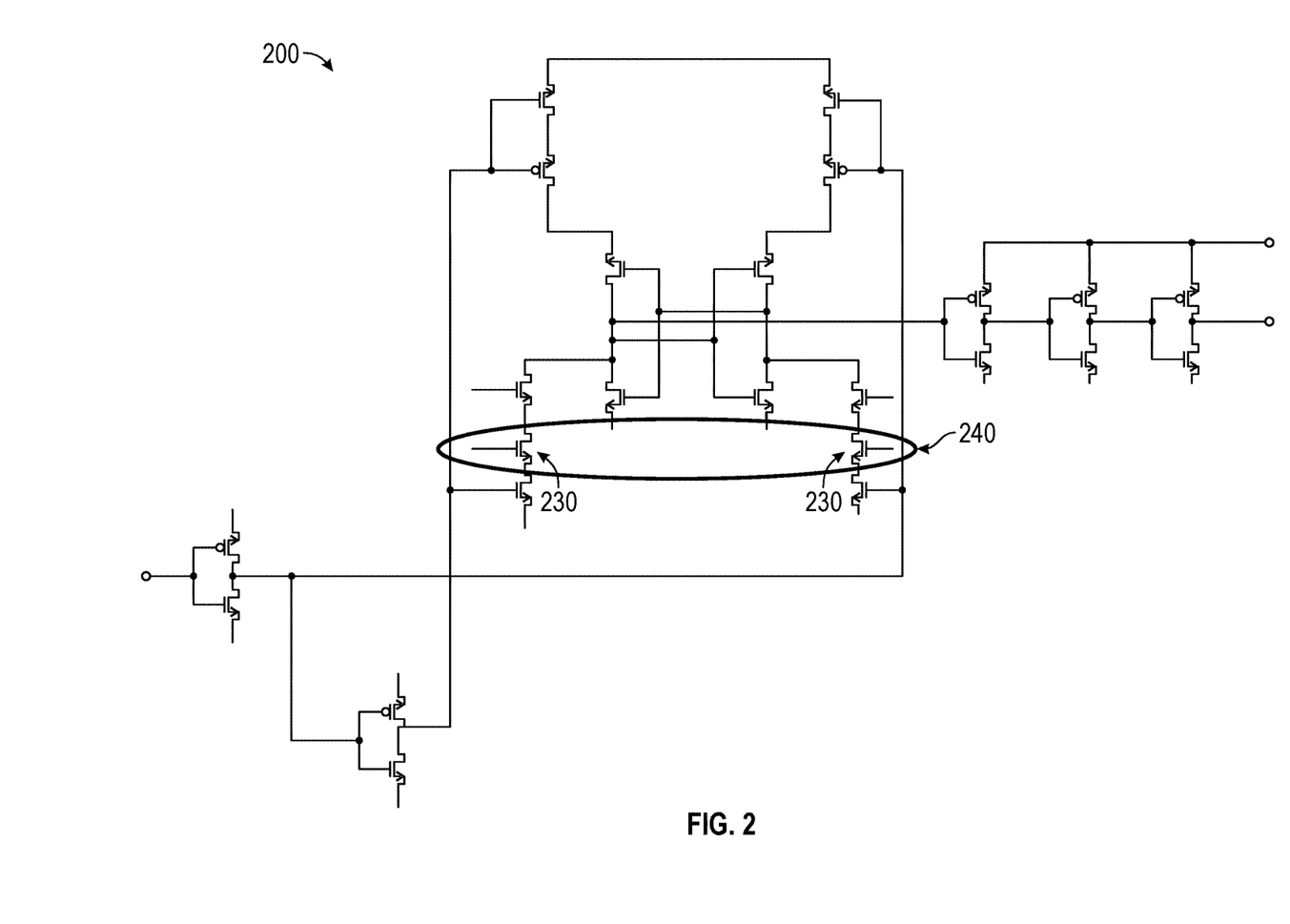
FIG. 2 illustrates an example schematic diagram of the voltage level shifter illustrated in FIG. 1.

FIG. 2 illustrates an example schematic diagram 200 of the voltage level shifter 110 illustrated in FIG. 1. Illustrated in FIG. 2 are two N-type metal oxide semiconductor (NMOS) transistor devices 230 shown within an elliptical ring 240 in the middle of the example schematic diagram. The elliptical ring 240 is not part of the circuitry of the schematic diagram 200 but is added to indicate the NMOS transistor devices 230. As an example, the NMOS transistor devices 230 are gated with a reference voltage. For example, the gate inputs of the NMOS transistor devices 230 receive an external reference voltage to shift the voltage range of an input signal from a core voltage range to a pad voltage range.

Figure 3:
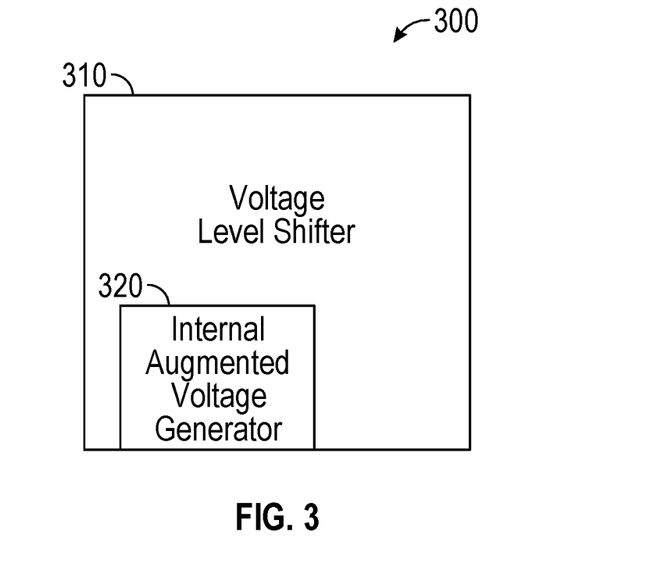
FIG. 3 illustrates an example voltage level shifter architecture which includes a voltage level shifter with an internal augmented voltage generator.

FIG. 3 illustrates an example voltage level shifter architecture 300 which includes a voltage level shifter 310 with an internal augmented voltage generator 320. In one example, the voltage level shifter 310 is a core to pad level shifter. As illustrated in FIG. 3, the voltage level shifter 310 incorporates within the internal augmented voltage generator 320, and thus, does not require an external power supply. For example, the voltage level shifter 310 may utilize the same circuit area (i.e., footprint) as a voltage level shifter (e.g., the voltage level shifter 110 shown in FIG. 1) that uses an external augmented voltage source. In the example of FIG. 3, the voltage level shifter 310 provides a voltage level shift from a core voltage level to a pad voltage level (e.g., from a low voltage state to a high voltage state).

Figure 4:
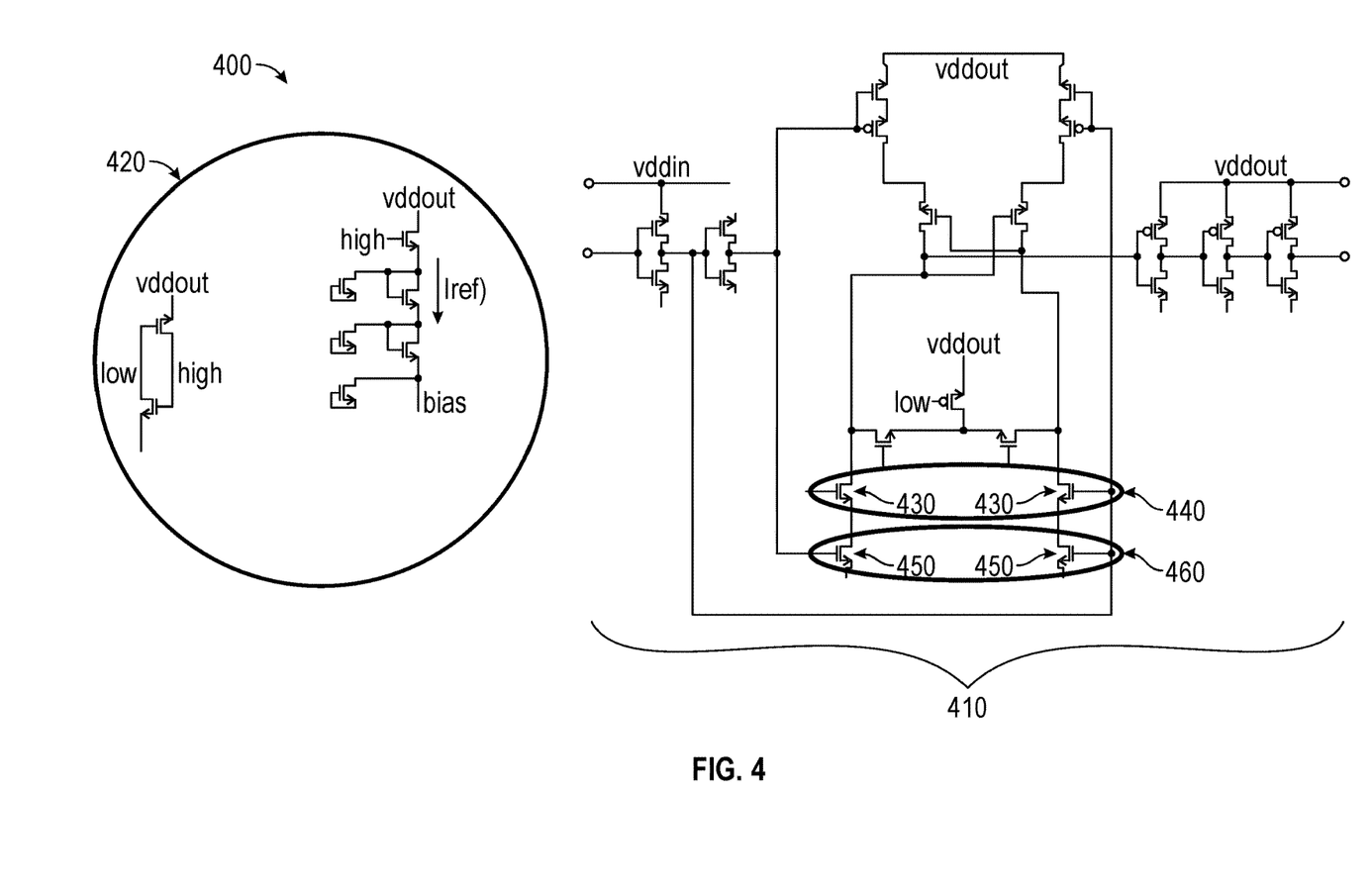
FIG. 4 illustrates an example schematic diagram of the voltage level shifter architecture illustrated in FIG. 3.

FIG. 4 illustrates an example schematic diagram 400 of the voltage level shifter architecture 300 illustrated in FIG. 3. The example schematic diagram 400 shows the voltage level shifter schematic diagram portion 410 on the right side and the internal augmented voltage generator schematic diagram portion 420 on the left side. In one example, the voltage level shifter 310 incorporates the internal augmented voltage generator 320 to increase operational range. As shown in FIG. 4, the circuitry of the voltage level shifter may include NMOS transistor devices (such as thick oxide NMOS transistor devices and thin oxide NMOS transistor devices) as well as electrical interconnects (e.g., traces, conductors, wirings, etc.) for coupling the various NMOS transistor devices. And, the circuitry of the voltage level shifter resides within a footprint of the voltage level shifter.

Illustrated in FIG. 4 are two NMOS transistor devices 430 shown within an elliptical ring 440 in the lower-right side of the example schematic diagram. The elliptical ring 440 is not part of the circuitry of the schematic diagram 400 but is added to indicate the two NMOS transistor devices 430. In one example, the two NMOS transistor devices 430 are thick oxide NMOS transistor devices. As an example, the NMOS transistor devices 430 are gated with a reference voltage. For example, the gate inputs of the NMOS transistor devices 430 receive an internal reference voltage to shift the voltage range of an input signal from a core voltage range to a pad voltage range. For example, the internal augmented voltage generator 320 (illustrated in FIG. 4 by the internal augmented voltage generator schematic diagram portion 420) and the NMOS transistor devices 430 assists in shifting the voltage range of an input signal from a core voltage range to a pad voltage range, for example, by two thin oxide NMOS transistor devices 450. As illustrated in FIG. 4, the two thin oxide NMOS transistor devices 450 are shown within the lower elliptical ring 460. The lower elliptical ring 460 is not part of the circuitry of the schematic diagram 400 but is added to indicate the two thin oxide NMOS transistor devices 450.

In one example, a depth of an oxide layer in a metal oxide semiconductor (MOS) transistor device (e.g., NMOS transistor device) is an important process parameter. An oxide layer may separate a gate terminal from either a source terminal or drain terminal of the MOS transistor device (e.g., NMOS transistor device). For example, a thick oxide NMOS transistor device may have an oxide layer thickness of 10 nanometers or greater. And, for example, a thin oxide NMOS transistor device may have an oxide layer thickness of less than 10 nanometers.

In one example, the internal augmented voltage generator 320 replaces the functionality of an external augmented voltage source (e.g., external augmented voltage source 120 as shown in FIG. 1). Although the external augmented voltage source may provide a nearly constant global voltage, it requires a voltage regulator circuit and additional resistors which consumes circuit area (i.e., footprint). Additionally, an external augmented voltage source may also incur overhead in in circuit pin count and in the voltage routing.

In one example, the internal augmented voltage generator 320 requires no extra circuit pin count and no extra voltage routing. Since the internal augmented voltage generator 320 is housed within the voltage level shifter 310, no additional circuit area (i.e., footprint) is required. In one example, the voltage level shifter 310 is capable of shifting signal voltage levels from a low voltage state to a high voltage state. In one example, the low voltage state may be 1.05 volts plus or minus a small tolerance voltage. One skilled in the art would understand that the recommended reliability limits may depend on the circuit application and/or the transistor technology.

Figure 5:
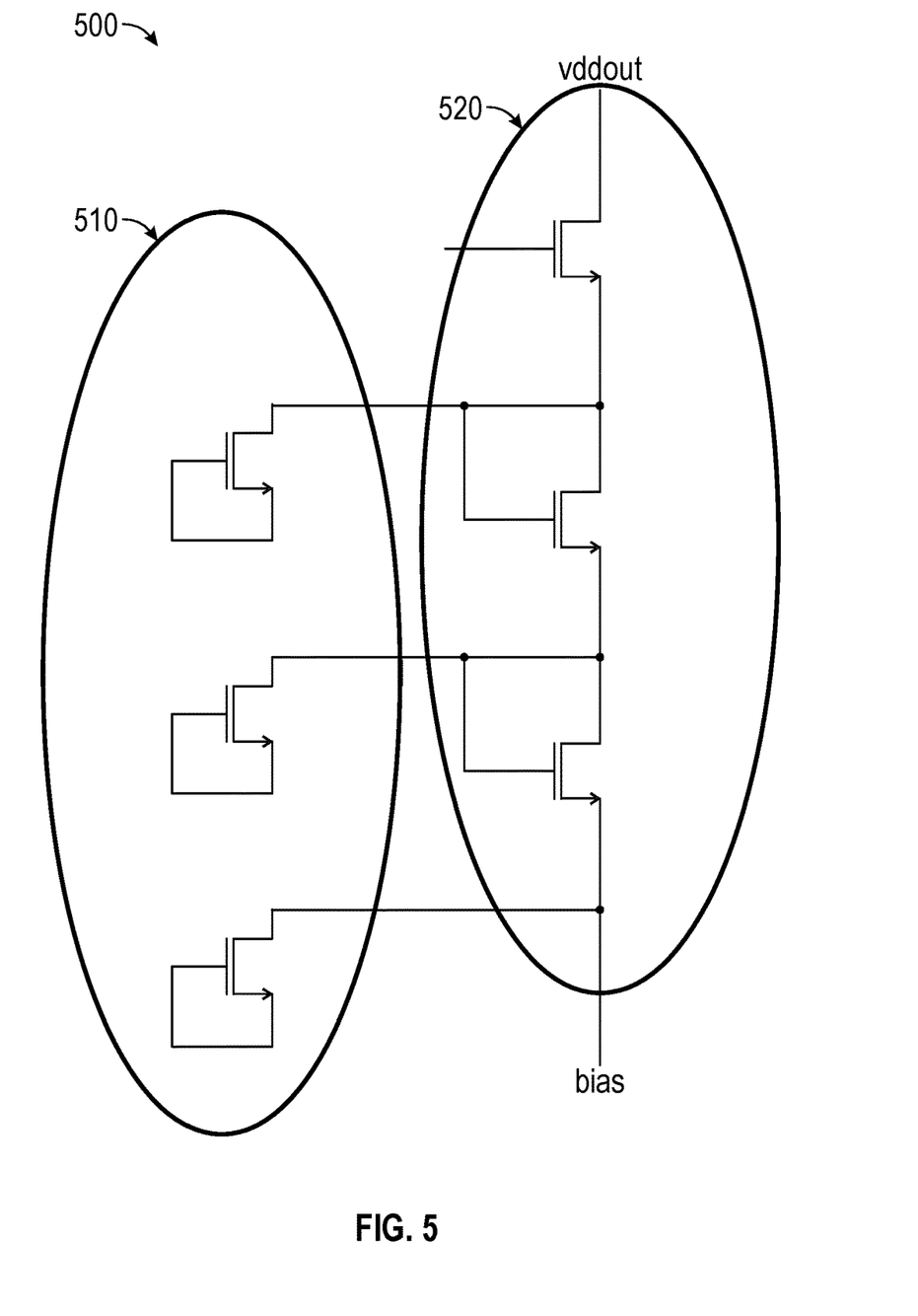
FIG. 5 illustrates an example schematic diagram of an internal augmented voltage generator.

FIG. 5 illustrates an example schematic diagram 500 of an internal augmented voltage generator. In one example, the circuit schematic diagram 500 represents a schematic diagram for the internal augmented voltage generator 320 illustrated in FIG. 3. Two elliptical rings 510, 520 are shown in FIG. 5. The two elliptical rings 510, 520 are not part of the circuitry of the schematic diagram 500 but is added for indication purposes. Shown within elliptical ring 510 are grounded gate NMOS transistors. And, shown within elliptical ring 520 are diode-connected NMOS transistors. In one example, the grounded gate NMOS transistors provide a voltage drop. In one example, the voltage drop is a function of a) the threshold voltage of the grounded gate NMOS transistors and b) the process, voltage, temperature (PVT) conditions. In one example, the grounded gate NMOS transistors help in stabilizing a voltage drop provided by the diode-connected NMOS transistors across PVT conditions. The co-design of the internal augmented voltage generator and voltage level shifter (i.e., the voltage level shifter including within it the internal augmented voltage generator) results in an augmented voltage which is maintained in a voltage range that ensures proper circuit operation which is robust against PVT and operational speed variations.

In one example, the voltage level shifter architecture 300 (shown in FIG. 3 and whose schematic diagram is shown in FIG. 4) includes a voltage level shifter including circuitry residing within a footprint; and an internal augmented voltage generator residing within the footprint, wherein the internal augmented voltage generator is coupled to the voltage level shifter to augment a voltage level shift. In one example, the voltage level shifter 310 includes at least two thick oxide NMOS transistor devices. The internal augmented voltage generator may include a plurality of diode connected NMOS transistor devices, wherein each of the diode connected NMOS transistor devices is electrically connected to each other in series. The internal augmented voltage generator may also include a plurality of grounded gate NMOS transistor devices, wherein each of the grounded gate NMOS transistor devices is electrically connected. In one example, grounded gate NMOS transistor devices are electrically connected to the diode connected NMOS transistor devices. In another example, each of the plurality of grounded gate NMOS transistor devices is electrically connected to one or more of the diode connected NMOS transistor devices. Each NMOS transistor devices include a gate, a source and a drain.

As shown in FIG. 5, some of the drains of the grounded gate NMOS transistor devices are connected to some of the gates of the diode connected NMOS transistor devices. In one example, the internal augmented voltage generator 320 generates an augmented voltage (a.k.a. bias). In one example, the two thick oxide NMOS transistor devices of the voltage level shifter 310 receive the augmented voltage. In one example, the voltage level shifter 310 includes at least two thin oxide NMOS transistor devices, wherein the at least two thin oxide NMOS transistor devices are coupled to the input signal whose voltage range is shifted from core voltage range to pad voltage range.

In one example, all routing resources for coupling the internal augmented voltage generator 320 to the voltage level shifter 310 reside within the footprint of the voltage level shifter architecture 300. It may be understood that the footprint of the voltage level shifter architecture 300 is the same as the footprint of the voltage level shifter 310. This is because, although the voltage level shifter architecture 300 includes the voltage level shifter 310 and the internal augmented voltage generator 320, the internal augmented voltage generator 320 resides within the footprint of the voltage level shifter 310.

Although the schematic diagrams 400, 500 of FIGS. 4 and 5, respectively disclose NMOS and PMOS transistor devices, it is also within the scope and spirit of the present disclosure to implement one or more of the following: junction field effect transistors (JFETs), and/or bipolar transistor devices, etc. Due to complementary operation of the voltage level shifter 310, one of the thin-oxide NMOS transistor devices is alternately on and has to discharge a pad voltage level. The thick-oxide NMOS transistor devices aid the discharges. In one example, the thick-oxide NMOS transistor devices receive the pad voltage at their drain terminal and the internal augmented voltage at their gate terminal, thereby the voltage at their source terminal is brought down to a level that the thin-oxide NMOS transistor devices can reliably discharge.

Figure 6:
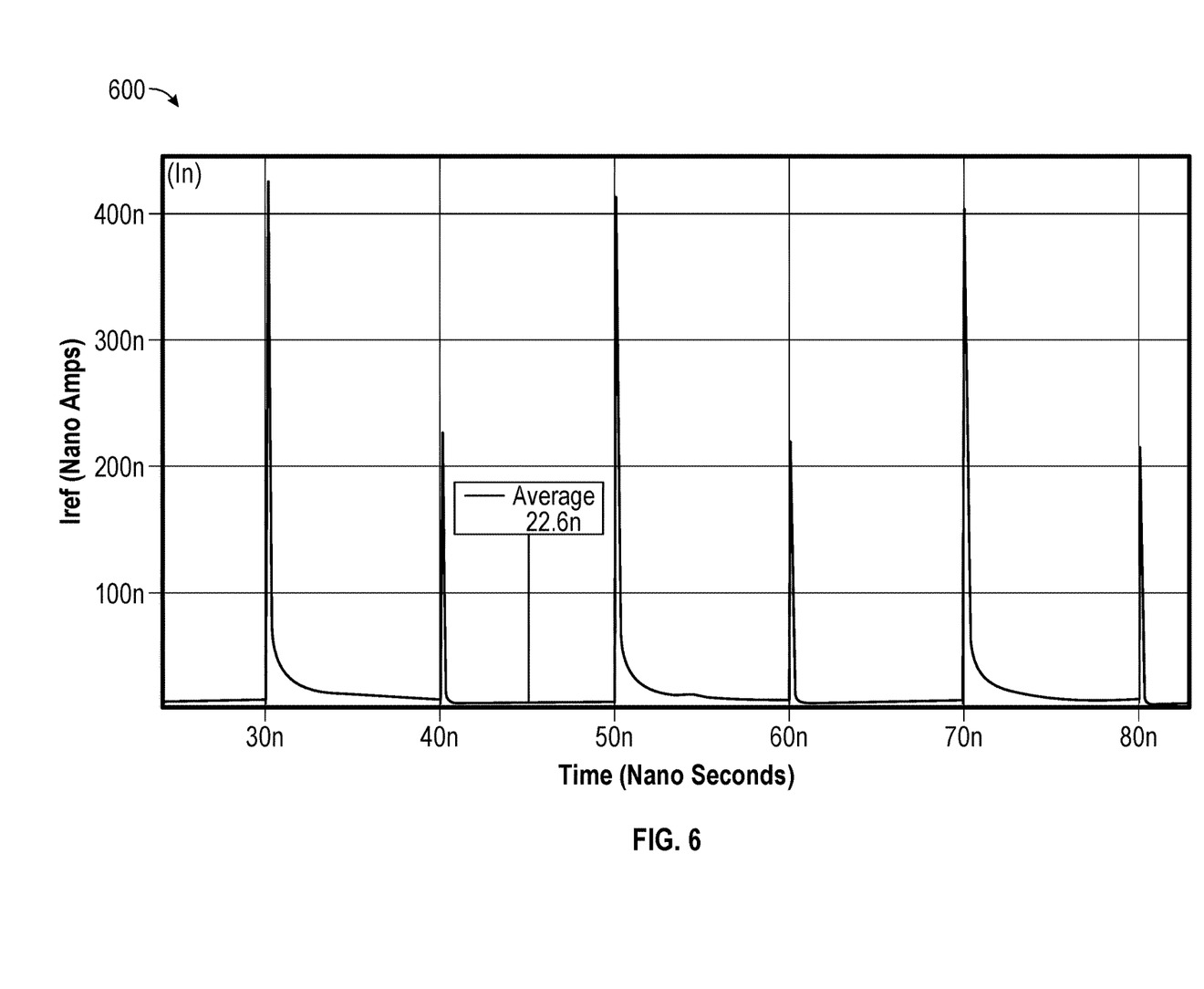
FIG. 6. illustrates an example current graphical diagram showing a reference current flowing through an internal augmented voltage generator as a function of time.

FIG. 6. illustrates an example current graphical diagram 600 showing a reference current $I_{ref}$ flowing through an internal augmented voltage generator (e.g., internal augmented voltage generator 320) as a function of time. In the current graphical diagram 600, the horizontal axis is time, in units of nanoseconds, and the vertical axis is current ($I_{ref}$), in units of nanoamps. In the current graphical diagram 600, the core voltage is 0.515 volts, the pad voltage is 1.95 volts, the transistor process type is fast/fast (FF), and the temperature is 125 degrees Celsius. The notation of transistor process type written as process1/process2 (e.g., FF) refers to the NMOS process as process1 and the PMOS process as process2. For example, FF means that the NMOS process is F (i.e., fast) and the PMOS process is F (fast). In the current graphical diagram 600, the reference current ($I_{ref}$) exhibits a periodicity of approximately 10 nanoseconds (e.g., 100 MHz switching rate). Also, in the current graphical diagram 600, the average of the reference current ($I_{ref}$) is 22.6 nanoamps.

Figure 7:
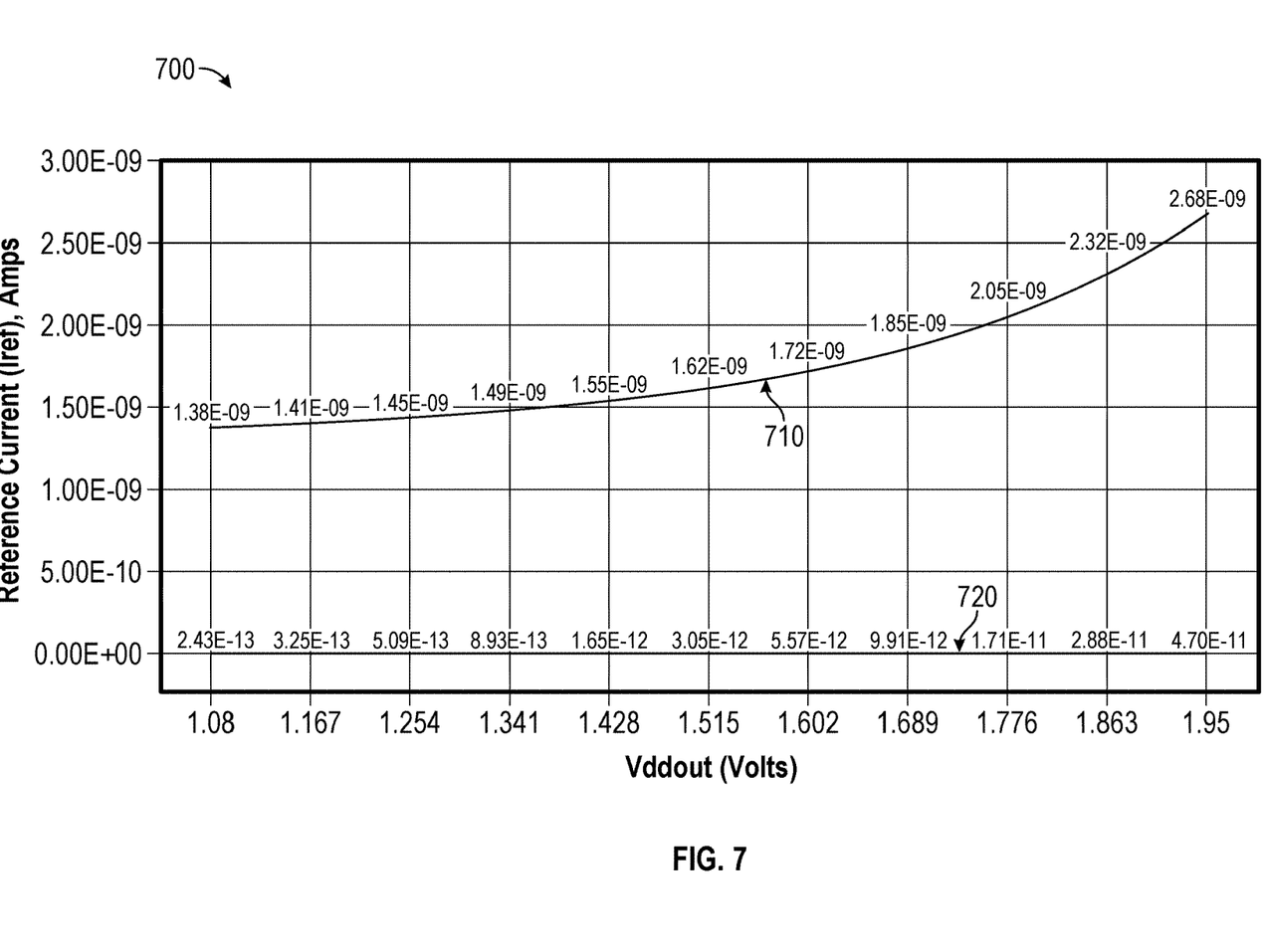
FIG. 7 illustrates an example graph of reference current versus drain voltage of an internal augmented voltage generator.

FIG. 7 illustrates an example graph 700 of reference current ($I_{ref}$) versus drain voltage ($V_{ddout}$) of an internal augmented voltage generator (e.g., internal augmented voltage generator 320 shown in FIG. 3). In graph 700, the vertical axis is the reference current ($I_{ref}$) in units of Amps, and the horizontal axis is drain voltage in units of volts. In the graph 700, two reference current traces are shown: the top trace 710 corresponds to the reference current ($I_{ref}$) versus drain voltage ($V_{ddout}$) for a temperature of 125 degrees Celsius, and the bottom trace 720 corresponds to reference current ($I_{ref}$) vs. drain voltage ($V_{ddout}$) for a temperature of minus 40 degrees Celsius. In this example, the two traces (i.e., top trace 710 and bottom trace 720) demonstrate that the internal augmented voltage generator has a low leakage current since the bias voltage is connected to the NMOS gate terminal.

Figure 8:
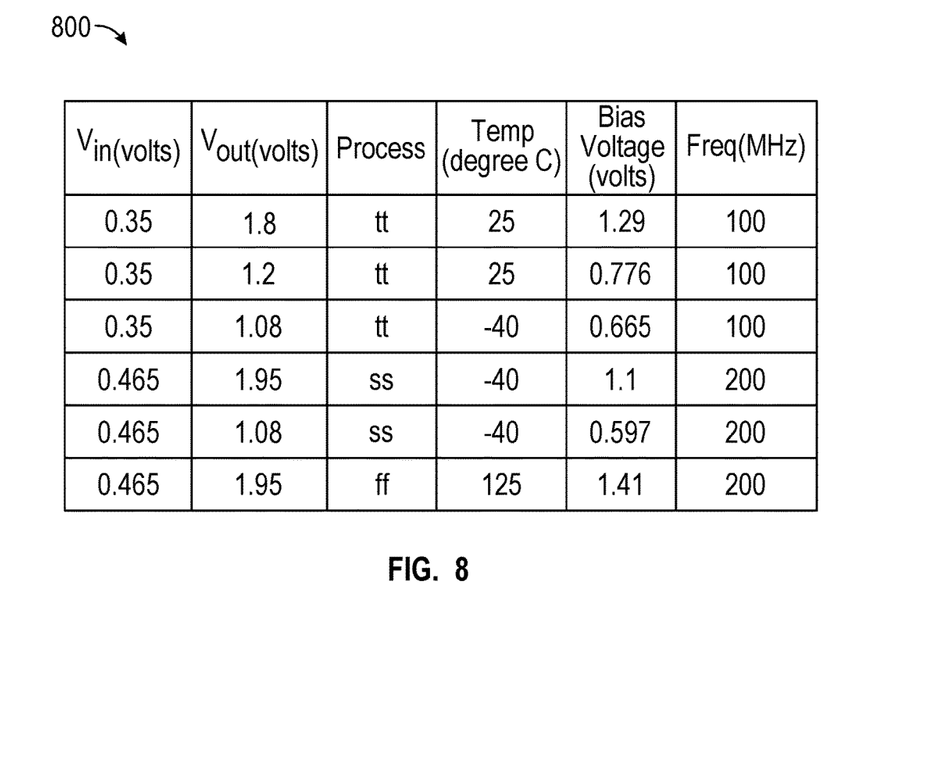
FIG. 8 illustrates an example tabulation of functional verification of the input drain voltage and output drain voltage of a voltage level shifter across process, voltage, temperature (PVT) conditions.

FIG. 8 illustrates an example tabulation 800 of functional verification of the input drain voltage ($V_{in}$) and output drain voltage ($V_{out}$) of a voltage level shifter (e.g., voltage level shifter 310 shown in FIG. 3) across process, voltage, temperature (PVT) conditions. For example, the first column shows input drain voltage ($V_{in}$) in volts, the second column shows output drain voltage ($V_{out}$) in volts, the third column shows process type, the fourth column shows temperature in degrees Celsius, the fifth column shows bias voltage in volts, and the sixth column shows frequency in megahertz (MHz). In one example, the bias voltage is governed by the voltage of the output drain voltage ($V_{out}$). For the third column, the notation of transistor process type is written as process1/process2 (e.g., tt) refers to the NMOS process as process1 and the PMOS process as process2. For example, the process type notation "tt" refers to typical/typical, "ss" refers to slow/slow, and "ff" refers to fast/fast.

Figure 9:
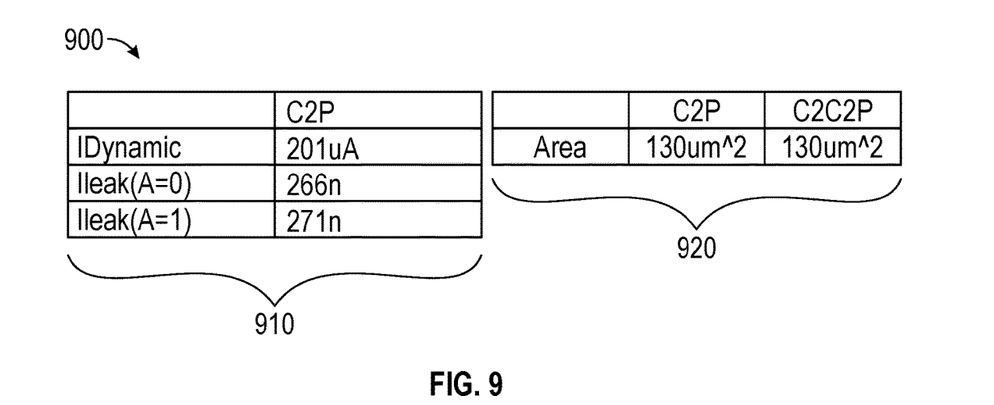
FIG. 9 illustrates an example tabulation of power and area profile values for a voltage level shifter.

FIG. 9 illustrates an example tabulation 900 of power and area profile values for a voltage level shifter (e.g., voltage level shifter 310 shown in FIG. 3). As shown in FIG. 9, the left tabulation section 910 tabulates current consumption for the voltage level shifter (e.g., voltage level shifter 310) for three circuit conditions: dynamic, static with input A=0 and static with input A=1, where A is a logic input and has bilevel values of 0 or 1. Also, the label "C2P" denotes core to pad.

As shown in FIG. 9, the right tabulation section 920 tabulates area (in square micrometers) for a voltage level shifter with an internal augmented voltage generator (e.g., the voltage level shifter architecture 300 which includes a voltage level shifter 310 with an internal augmented voltage generator 320 as shown in FIG. 3) which is labeled "C2P" and a voltage level shifter (e.g., voltage level shifter 110 shown in FIG. 1) labeled "C2C2P" which uses an external augmented voltage source. The label "C2C2P" denotes core to core to pad. As shown in the tabulation 900, the circuit area for the voltage level shifter with an internal augmented voltage generator (labeled as "C2P") is the same as that for the voltage level shifter which uses an external augmented voltage source (labeled as "C2C2P").

Figure 10:
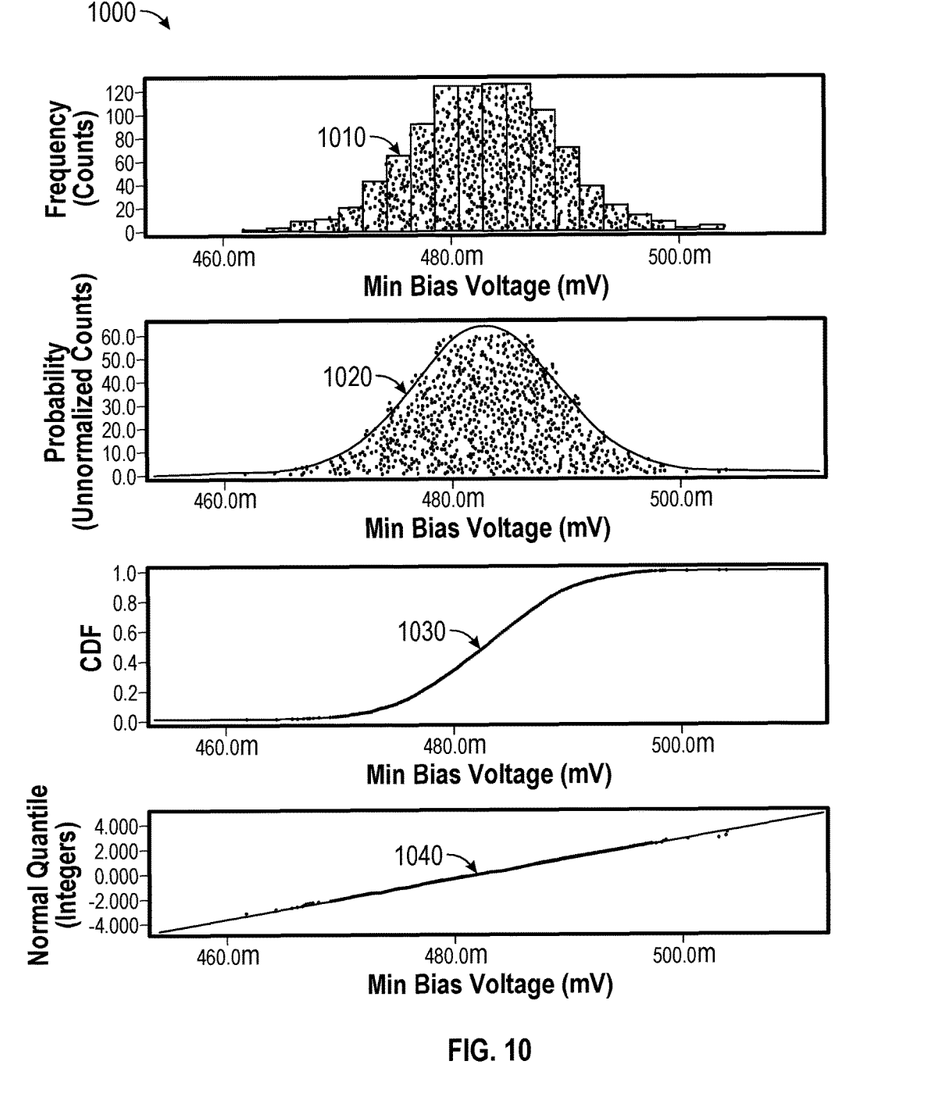
FIG. 10 illustrates an example of graphical results of a statistical simulation of bias voltage distribution for a voltage level shifter.

FIG. 10 illustrates an example of graphical results 1000 of a statistical simulation of bias voltage distribution for a voltage level shifter (e.g., voltage level shifter 310 shown in FIG. 3). In FIG. 10, the statistical simulation is based on a Monte Carlo simulation. However, one skilled in the art would understand that other types of statistical simulation may be applied within the scope and spirit of the present disclosure. Regarding the graphical results 1000, the voltage level shifter is implemented using 7 nm line technology. In FIG. 10, the first graph 1010 shows a histogram of minimum bias voltage from an internal augmented voltage generator (e.g., internal augmented voltage generator 320) to a voltage level shifter (e.g., voltage level shifter 310). The horizontal axis for the first graph 1010 is the minimum bias voltage in units of millivolts, and the vertical axis is the frequency in units of counts.

In FIG. 10, the second graph 1020 shows a probability density of minimum bias voltage from the internal augmented voltage generator (e.g., internal augmented voltage generator 320) to the voltage level shifter (e.g., voltage level shifter 310). The horizontal axis for the second graph 1020 is the minimum bias voltage in units of millivolts, and the vertical axis is the relative probability in units of unnormalized counts.

In FIG. 10, the third graph 1030 shows a cumulative distribution of minimum bias voltage from the internal augmented voltage generator (e.g., internal augmented voltage generator 320) to the voltage level shifter (e.g., voltage level shifter 310). The horizontal axis for the third graph 1030 is the minimum bias voltage in units of millivolts, and the vertical axis is the cumulative distribution function (CDF) which is dimensionless.

In FIG. 10, the fourth graph 1040 shows a normal quartile of minimum bias voltage from the internal augmented voltage generator (e.g., internal augmented voltage generator 320) to the voltage level shifter (e.g., voltage level shifter 310). The horizontal axis for the fourth graph 1040 is the minimum bias voltage in units of millivolts, and the vertical axis is normal quartile in units of integers. In the graphical results 1000, the statistical simulation shows that the minimum bias voltage (a.k.a., minimum reference voltage) is within a prescribed limit such that thick-oxide transistors are not extending into a cut-off region.

Figure 11:
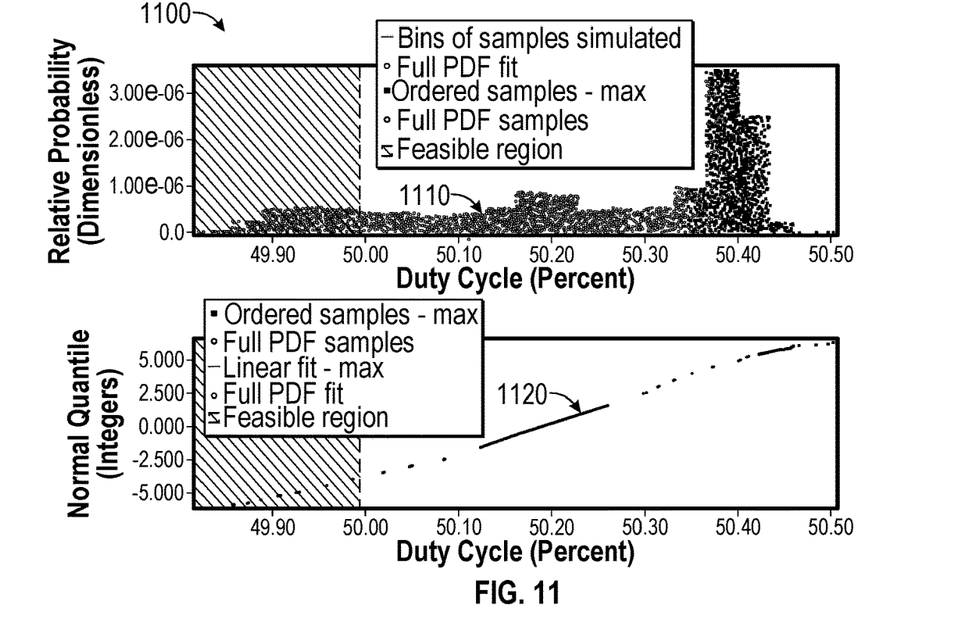
FIG. 11 illustrates a first example of graphical results of a statistical simulation of duty cycle variation for a voltage level shifter.

FIG. 11 illustrates a first example of graphical results 1100 of a statistical simulation of duty cycle variation for a voltage level shifter (e.g., voltage level shifter 310 shown in FIG. 3). In FIG. 11, the core voltage is 0.465 volts, the pad voltage is 1.08 volts, the process type is SS (slow/slow), and temperature is −40 degrees Celsius. In the graphical results 1100, the statistical simulation is based on a Monte Carlo simulation. However, one skilled in the art would understand that other types of statistical simulation may be application within the scope and spirit of the present disclosure. In FIG. 11 the first graph 1110 shows a probability density of duty cycle. The horizontal axis for the first graph 1110 is duty cycle in percent and the vertical axis is relative probability (dimensionless). In FIG. 11 the second graph 1120 shows a normal quantile of duty cycle. The horizontal axis for the first graph 1110 is duty cycle in percent and the vertical axis is normal quartile in units of integers. In the graphical results 1100, the statistical simulation shows output duty cycle variation is within a prescribed range, for example, 50%+/−2%.

Figure 12:
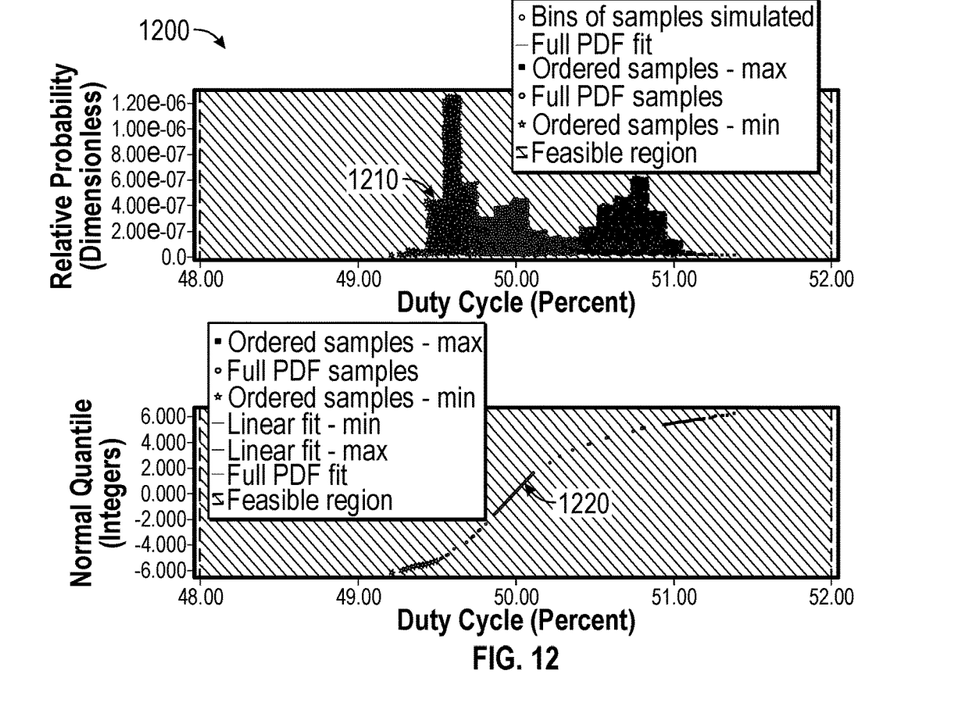
FIG. 12 illustrates a second example of graphical results of a statistical simulation of duty cycle variation for a voltage level shifter.

FIG. 12 illustrates a second example of graphical results 1200 of a statistical simulation of duty cycle variation for a voltage level shifter (e.g., voltage level shifter 310 shown in FIG. 3). In FIG. 12, the core voltage is 0.465 volts, the pad voltage is 1.95 volts, the process type is SS (slow/slow), and temperature is −40 degrees Celsius. In the graphical results 1200, the statistical simulation is based on a Monte Carlo simulation. However, one skilled in the art would understand that other types of statistical simulation may be application within the scope and spirit of the present disclosure. In FIG. 12 the first graph 1210 shows a probability density of duty cycle. The horizontal axis for the first graph 1210 is duty cycle in percent and the vertical axis is relative probability (dimensionless). In FIG. 12 the second graph 1220 shows a normal quantile of duty cycle. The horizontal axis for the first graph 1210 is duty cycle in percent and the vertical axis is normal quartile in units of integers. In the graphical results 1200, the statistical simulation shows output duty cycle variation is within a prescribed range, for example, 50%+/−2%.

Figure 13:
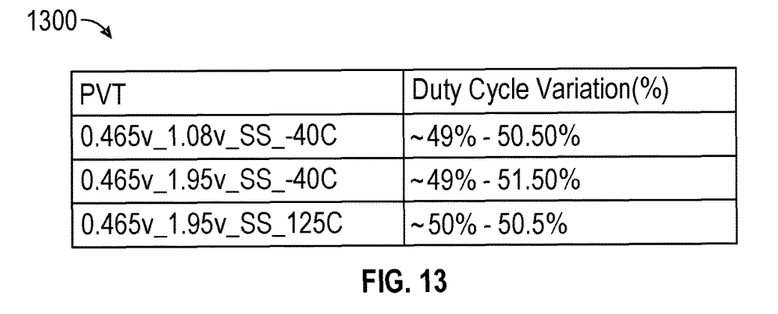
FIG. 13 illustrates an example tabulation of output duty cycle variation for several process, voltage, temperature (PVT) conditions based on a statistical simulation.

FIG. 13 illustrates an example tabulation 1300 of output duty cycle variation for several process, voltage, temperature (PVT) conditions based on a statistical simulation. In one example, the statistical simulation may be based on a Monte Carlo simulation. In other examples, other types of statistical simulation may be used and be within the scope and spirit of the present disclosure. In the tabulation 1300, each PVT case in the first column lists core voltage, pad voltage, process type and temperature, in that order. In the tabulation 1300, the duty cycle variation, in percent, for each PVT case is listed in the second column. As shown in FIG. 13, in the example PVT cases listed in the tabulation 1300, the output duty cycle variation is less than 3%. In addition, other simulation results show that the voltage level shifter (e.g., voltage level shifter 310 shown in FIG. 3) supports a core voltage range of 0.35 v to 1.155 v, a pad voltage range of 1.08 v to 1.95 v, all process types (SS, TT, FF, SF, FS), and a temperature range of −40 degrees Celsius to +125 degrees Celsius. In the simulation results, the current consumption of the internal augmented voltage generator is approximately 22 nanoamps. In one example, the power savings due to usage of an internal augmented voltage generator (e.g. internal augmented voltage generator 320) is approximately 10%, due to, for example, lower circuit capacitance than with an external augmented voltage source (e.g. external augmented voltage source 120).

Although the graphical results and/or tabulation results shown in FIGS. 6-13 are stated as being applicable to the voltage level shifter 310 or to the internal augmented voltage generator 310, they may be equally applicable to the voltage level shifter architecture 300 (as shown in FIG. 3) since the voltage level shifter architecture 300 includes the voltage level shifter 310 which includes the internal augmented voltage generator 320.

Figure 14:
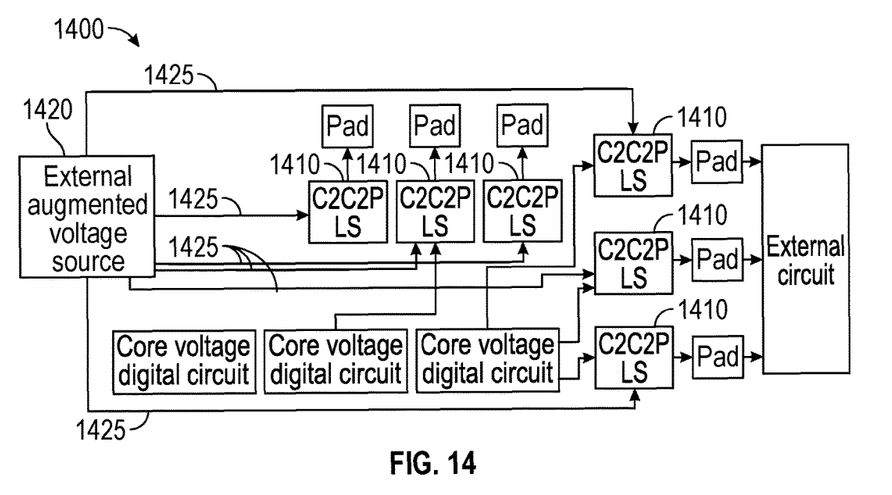
FIG. 14 illustrates an example interface diagram of a set of voltage level shifters that uses an external augmented voltage source.

FIG. 14 illustrates an example interface diagram 1400 of a set of voltage level shifters 1410 (e.g., multiple quantities of voltage level shifters 110 shown in FIG. 1) that uses an external augmented voltage source 1420 (e.g., external augmented voltage source 120 shown in FIG. 1). The set of voltage level shifters 1410 is labeled as C2C2P LS (core to core to pad level shifter) and use an external augmented voltage source 1420. As shown in FIG. 14, routing resources 1425 are needed to connect every voltage level shifter of the set of voltage level shifters 1410 to the external augmented voltage source 1420. In the example shown in FIG. 14, since there are six voltage level shifters in the set of voltage level shifters 1410, then six routing resources 1425 are needed. Thus, the quantity of routing resources 1425 increases proportionally with the quantity of voltage level shifters.

Figure 15:
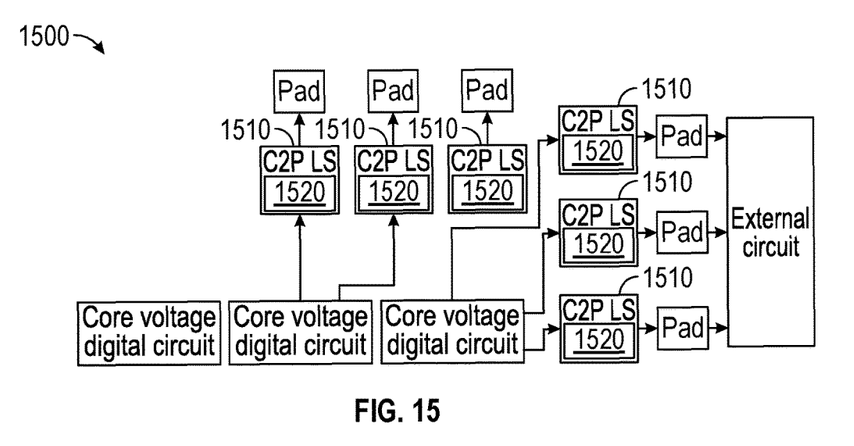
FIG. 15 illustrates an example interface diagram of a set of voltage level shifters wherein each voltage level shifter includes an internal augmented voltage generator.

FIG. 15 illustrates an example interface diagram 1500 of a set of voltage level shifters 1410 (e.g., multiple quantities of voltage level shifters 310 shown in FIG. 3) wherein each voltage level shifter includes an internal augmented voltage generator 1520 (e.g., internal augmented voltage generator 320 shown in FIG. 3). The set of voltage level shifters 1510 is labeled as C2P LS (core to pad level shifter) and each includes an internal augmented voltage generator 1520 within. In comparison to FIG. 14, routing resources 1425 are not needed to connect every voltage level shifter to its augmented voltage generator since each internal augmented voltage generator 1520 resides within its respective voltage level shifter 1510. Thus, in the example of FIG. 15, there is no need of routing resources outside of each footprint of each voltage level shifter for connecting to an augmented voltage source. That is, the routing resource for connecting each internal augmented voltage generator to its respective voltage level shifter resides within the footprint of the respective voltage level shifter.

Figure 16:
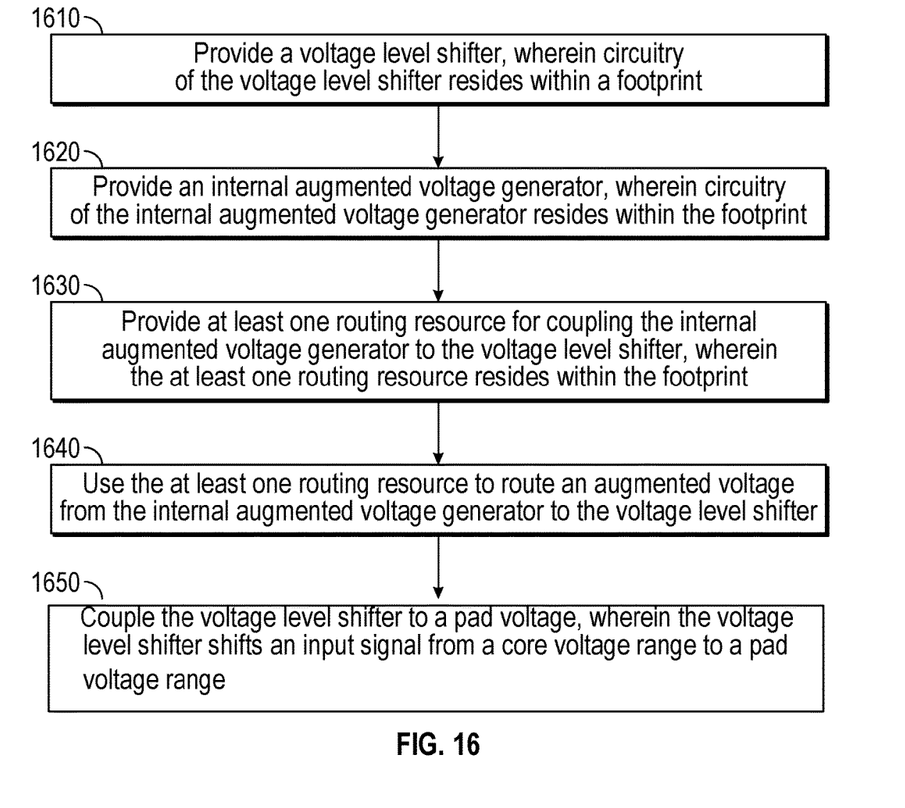
FIG. 16 illustrates an example flow diagram for implementing a voltage level shifter that includes an internal augmented voltage generator.

FIG. 16 illustrates an example flow diagram 1600 for implementing a voltage level shifter that includes an internal augmented voltage generator. In block 1610, provide a voltage level shifter, wherein circuitry of the voltage level shifter resides within a footprint. In block 1620, provide an internal augmented voltage generator, wherein circuitry of the internal augmented voltage generator resides within the footprint. In block 1630, provide at least one routing resource for coupling the internal augmented voltage generator to the voltage level shifter, wherein the at least one routing resource resides within the footprint. In one example, the at least one routing resource is used to couple a circuitry of the voltage level shifter to a circuitry of the internal augmented voltage generator. In block 1640, use the at least one routing resource to route an augmented voltage from the internal augmented voltage generator to the voltage level shifter. In block 1650, couple the voltage level shifter to a pad voltage, wherein the voltage level shifter shifts an input signal from a core voltage range to a pad voltage range. In one example, the voltage level shifter includes at least two thin oxide transistor devices which are coupled to a pad voltage to shift an input signal from a core voltage range to a pad voltage range.

In one example, the circuitry of the voltage level shifter may include one or more transistor devices. In one example, the circuitry of the internal augmented voltage generator may include one or more transistor devices. The transistor devices in either the circuitry of the voltage level shifter and/or the circuitry of the internal augmented voltage generator may be one or more NMOS transistor devices, CMOS transistor devices, PMOS transistor devices, JFETs, and/or bipolar transistor devices, etc.

In one aspect, one or more of the steps for implementing a voltage level shifter in FIG. 16 may be executed by one or more processors which may include hardware, software, firmware, etc. In one aspect, one or more of the steps in FIG. 16 may be executed by one or more processors which may include hardware, software, firmware, etc. The one or more processors, for example, may be used to execute software or firmware needed to perform the steps in the flow diagram of FIG. 14. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for implementing a voltage level shifter. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A level shifter architecture, comprising:
    a voltage level shifter including circuitry residing within a footprint; and
    an internal augmented voltage generator residing within the footprint, wherein the internal augmented voltage generator is coupled to the voltage level shifter to augment a voltage level shift, wherein the internal augmented voltage generator comprises:
        a plurality of diode connected NMOS transistor devices, wherein each of the plurality of diode connected NMOS transistor devices are electrically connected to each other in series; and
        a plurality of grounded gate NMOS transistor devices, wherein each of the plurality of grounded gate NMOS transistor devices are electrically connected.

2. The level shifter architecture of claim 1, wherein the voltage level shifter comprises at least two thick oxide NMOS transistor devices.

3. The level shifter architecture of claim 1, wherein at least one of the plurality of grounded gate NMOS transistor devices is electrically connected to at least one of the plurality of diode connected NMOS transistor devices.

4. The level shifter architecture of claim 3, wherein the at least one of the plurality of grounded gate NMOS transistor devices includes a drain; and the at least one of the plurality of diode connected NMOS transistor devices includes a gate; and wherein the drain is electrically connected to the gate.

5. The level shifter architecture of claim 4, wherein the internal augmented voltage generator generates an augmented voltage.

6. The level shifter architecture of claim 5, wherein the at least two thick oxide NMOS transistor devices receive the augmented voltage.

7. The level shifter architecture of claim 1, wherein the voltage level shifter comprises at least two thin oxide NMOS transistor devices.

8. The level shifter architecture of claim 7, wherein the at least two thin oxide NMOS transistor devices are coupled to a pad voltage to shift a voltage range of an input signal.

9. The level shifter architecture of claim 1, further comprising a plurality of routing resources for coupling the internal augmented voltage generator to the voltage level shifter, wherein the plurality of routing resources resides within the footprint.

10. An apparatus for voltage level shifting, comprising:
    a voltage level shifter, wherein the voltage level shifter resides within a footprint and comprises at least two thick oxide transistor devices and at least two thin oxide transistor devices coupled to a pad voltage to shift a voltage range of an input signal; and
    an internal augmented voltage generator, wherein the internal augmented voltage generator resides within the footprint and is coupled to the voltage level shifter to provide an augmented voltage to the voltage level shifter, and wherein the internal augmented voltage generator comprises:
        a plurality of diode connected NMOS transistor devices, wherein each of the plurality of diode connected NMOS transistor devices are electrically connected to each other in series; and
        a plurality of grounded gate NMOS transistor devices, wherein each of the plurality of grounded gate NMOS transistor devices are electrically connected.

11. The apparatus of claim 10, wherein at least one of the plurality of grounded gate transistor devices is electrically connected to at least one of the plurality of diode connected transistor devices.

12. The apparatus of claim 11, wherein the at least one of the plurality of grounded gate transistor devices includes a drain; and the at least one of the plurality of diode connected transistor devices includes a gate; and wherein the drain is electrically connected to the gate.

13. The apparatus of claim 12, wherein the internal augmented voltage generator generates the augmented voltage.

14. The apparatus of claim 13, wherein the at least two thick oxide transistor devices receive the augmented voltage.

15. The apparatus of claim 10, further comprising a plurality of routing resources for coupling the internal augmented voltage generator to the voltage level shifter, wherein the plurality of routing resources resides within the footprint.

16. A method for implementing a voltage level shift, comprising:
    providing a voltage level shifter, wherein circuitry of the voltage level shifter resides within a footprint;
    providing an internal augmented voltage generator, wherein circuitry of the internal augmented voltage generator resides within the footprint, and wherein the internal augmented voltage generator comprises:
        a plurality of diode connected NMOS transistor devices, wherein each of the plurality of diode connected NMOS transistor devices are electrically connected to each other in series; and
        a plurality of grounded gate NMOS transistor devices, wherein each of the plurality of grounded gate NMOS transistor devices are electrically connected; and providing at least one routing resource for coupling the internal augmented voltage generator to the voltage level shifter, wherein the at least one routing resource resides within the footprint.

17. The method of claim 16, further comprising using the at least one routing resource to route an augmented voltage from the internal augmented voltage generator to the voltage level shifter.

18. The method of claim 16, further comprising coupling the voltage level shifter to a pad voltage, wherein the voltage level shifter shifts a voltage range of an input signal.

19. A computer-readable medium storing computer executable code, operable on a device comprising at least one processor and at least one memory coupled to the at least one processor, wherein the at least one processor is configured to implement a voltage level shifter, the computer executable code comprising:
    instructions for causing a computer to provide a voltage level shifter, wherein circuitry of the voltage level shifter resides within a footprint;
    instructions for causing the computer to provide an internal augmented voltage generator, wherein circuitry of the internal augmented voltage generator resides within the footprint, and wherein the internal augmented voltage generator comprises:
        a plurality of diode connected NMOS transistor devices, wherein each of the plurality of diode connected NMOS transistor devices are electrically connected to each other in series; and
        a plurality of grounded gate NMOS transistor devices, wherein each of the plurality of grounded gate NMOS transistor devices are electrically connected; and
    instructions for causing the computer to provide at least one routing resource for coupling the internal augmented voltage generator to the voltage level shifter, wherein the at least one routing resource resides within the footprint.

20. The computer-readable medium of claim 19, further comprising instructions for causing the computer to use the at least one routing resource to route an augmented voltage from the internal augmented voltage generator to the voltage level shifter.

21. The computer-readable medium of claim 19, further comprising instructions for causing the computer to couple the voltage level shifter to a pad voltage, wherein the voltage level shifter shifts a voltage range of an input signal.

\* \* \* \* \*